United States Patent [19]

Deo et al.

[11] 4,226,492
[45] Oct. 7, 1980

[54] ELECTRICAL INTERCONNECTION APPARATUS

[75] Inventors: Subhash R. Deo, Naperville; Chester C. Faudskar, Wheaton, both of Ill.

[73] Assignee: Bell Telephone Laboratories, Incorporated, Murray Hill, N.J.

[21] Appl. No.: 61,753

[22] Filed: Jul. 30, 1979

[51] Int. Cl.³ .............................................. H05K 1/08
[52] U.S. Cl. .............................................. 339/17 CF
[58] Field of Search .............. 339/17 R, 17 CF, 14 R; 174/52 FP

[56] References Cited

U.S. PATENT DOCUMENTS

| | | | |
|---|---|---|---|
| 3,353,263 | 11/1967 | Helms | 29/626 |
| 3,409,861 | 11/1968 | Barnes et al. | 339/17 CF |
| 3,497,947 | 3/1970 | Ardezzone | 29/577 |
| 3,587,029 | 6/1971 | Knowles | 339/14 R |
| 3,617,817 | 11/1971 | Kawakatsu | 174/52 FP |
| 3,781,457 | 12/1973 | McKerreghan | 174/52 S |
| 3,904,262 | 9/1975 | Cutchaw | 339/17 CF |

OTHER PUBLICATIONS

IBM Bulletin, Honn, vol. 15, No. 1, p. 308, 6-1972.
IBM Bulletin, Benenati, vol. 20, No. 6, p. 2221, 11-1977.

*Primary Examiner*—Neil Abrams
*Attorney, Agent, or Firm*—William H. Kamstra

[57] ABSTRACT

Electrical interconnection apparatus for mounting integrated circuit modules and for adapting the terminal pattern of the densely spaced leads of a module to the terminal pattern of the more widely spaced pin sockets of a printed wiring board. Rows of terminals (19, 20), spaced to conform to the module leads, are arranged on two sides of a module support platform (10) and are extended by conducting elements (27, 28, 29, 30) to particular terminal pins of a plurality of rows of terminal pins (21, 22, 23, 24, 25, 26) extending from the underside of lead frame blocks (11, 12) retained by the support platform (10). Ground plane elements (15, 16, 17, 18) are featured which are supported by the lead frame blocks (11, 12) between the terminal pin rows (21, 22, 23, 24, 25, 26) to control the impedance of the conducting elements (27, 28, 29, 30).

1 Claim, 3 Drawing Figures

ELECTRICAL INTERCONNECTION APPARATUS

TECHNICAL FIELD

This invention relates to electrical interconnection apparatus and particularly to such apparatus for interconnecting modular integrated circuit packages and printed wiring boards, for example.

BACKGROUND OF THE INVENTION

The microminiaturization and large scale integration of electrical components and circuits in recent years has made possible significant advances in terms of cost, reliability, power efficiency, and, importantly, size reduction. A typical integrated circuit module may, for example, present rectangular dimensions of only 0.5 inch or less on a side. This reduction in physical size is manifestly advantageous from the viewpoint of overall system space saving. The integration of frequently complete circuits in such extremely small modules, on the other hand, has also necessitated a high density of access leads extending from the sides of the module which may demand that the center-to-center spacing be held, for example, to 0.050 inch or less. This high lead density presents a serious problem where large numbers of integrated circuit modules are to be interconnected with each other and with other system circuitry. The modules are normally mounted on insulative printed wiring boards having a coordinate array of plated through access apertures or sockets adapted to receive electrical terminal pins which are interconnected with the integrated circuit module leads. Because of the dimensions of the pins and receiving apertures, a definite limit is imposed on the extent to which the spacings between the apertures may be reduced, which limit is still substantially greater than the module lead spacings. Some means must accordingly be provided to act as a circuit interface between the densely spaced leads of the integrated circuit module and the more widely spaced printed circuit board terminal apertures. Such an interface function has in the past been accomplished, for example, by individually connecting the module leads to terminals of the parent circuit board in patterns unique to each module lead number. Any change in module size and lead number necessitated a reorganization of the interconnection pattern. One lead frame arrangement for completing discrete connections between module leads and parent circuit board is shown, for example, in U.S. Pat. No. 3,781,457 of M. H. McKerreghan issued Dec. 25, 1973. Prior art interconnection arrangements in their individually designed inflexibility have thus added to the cost of mounting integrated circuit modules and have also increased the time required to mount modules of differing size and access lead number. It is the simplification and ordering of module-to-parent circuit board interconnections to which the apparatus of this invention is chiefly directed. It is also an object of this invention to provide a more broadly applicable module interconnection arrangement, one that is readily adaptable for mounting modules of various dimensions and lead number.

SUMMARY OF THE INVENTION

The aforementioned objectives are advantageously realized and a technical advance is achieved in accordance with the principles of the invention in an integrated circuit module mounting arrangement comprising a support platform for carrying the module, the platform being provided at two sides with terminals spaced to accord with the spacings of the module access leads. The platform terminals are extended to interconnect with a matrix of terminal pins extending from the underside of lead frame blocks mounted under the support platform, the pins being spaced and arranged to conform with the pin sockets of a printed wiring board or other parent circuit structure. In one embodiment of the invention, a pair of lead frame blocks is provided, each presenting three rows of terminal pins. The platform module terminals of each side are successively connected, for the outer of the triple rows, to the terminal pins by means of interconnection conducting elements lying in a common plane in the two lead frame blocks. More specifically, the first and every succeeding nth terminal of each platform side extends directly downward through a lead frame block to terminate in a terminal pin of the center row of a triple row. The second and third terminal of each platform side and every succeeding nth terminal are successively connected respectively by means of the interconnection conducting elements to the terminal pins of the outer rows of the triple rows, alternating between the two outer rows of pins. A feature of the module mounting apparatus is a pair of ground plane elements for each lead frame block which is spaced apart from and parallel to the common plane of the interconnection conducting elements for controlling the impedance of the latter elements.

BRIEF DESCRIPTION OF THE DRAWING

The organization of an integrated circuit module mounting arrangement according to this invention together with its features will be better understood from a consideration of the detailed description of one illustrative embodiment thereof which follows when taken in conjunction with the accompanying drawing in which.

DETAILED DESCRIPTION

Figure 1:
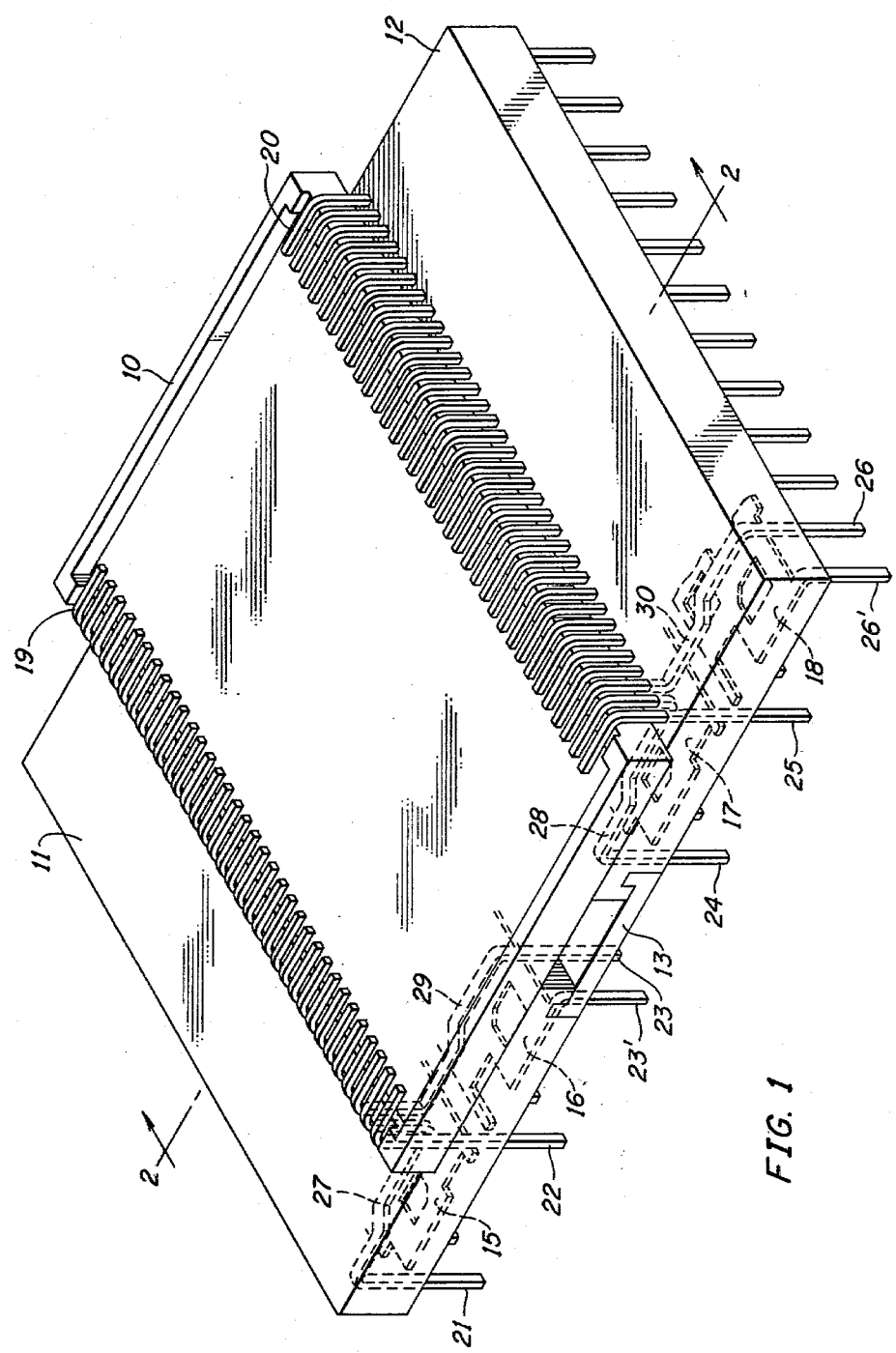
FIG. 1 is an enlarged perspective top view of one specific illustrative module mounting arrangement embodying the features of this invention showing the lead frame block mountings and, in partial broken outline, the terminal interconnections and ground planes.
Figure 2:
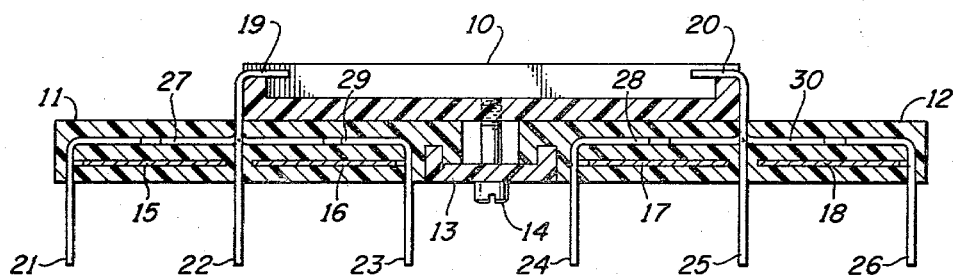
FIG. 2 is a section view in smaller scale of the mounting structure of FIG. 1 taken along the line 2—2.

An illustrative integrated circuit module mounting arrangement according to this invention is depicted in FIG. 1 and in section view in FIG. 2 as comprising a module support platform 10 dimensioned to carry a circuit module, not shown, having a plurality of access leads extending therefrom. Supported on the underside of platform 10 is a pair of lead frame blocks 11 and 12 which, in the embodiment being described, extend outward from the sides of platform 10. Blocks 11 and 12 may be retained by platform 10 in any convenient manner such as by a "U" shaped clamp bar 13 seated in grooves running the lengths of one side of each block and held in place by any suitable means such as by screw means 14. Platform 10 and blocks 11 and 12 may be formed of any suitable electrically insulative material such as molded plastic, for example, blocks 11 and 12 having embedded therein the electrical conducting elements for performing the interconnection function to be described. Also embedded in each of blocks 11 and 12 is a pair of electrical ground planes 15-16 and 17-18, respectively, representative portions of which are shown in hidden outline in FIG. 1.

The electrical interconnections carried by lead frame blocks 11 and 12 extend respectively from two rows of closely spaced terminals 19 and 20 to six rows of more widely spaced terminal pins 21 through 26, each lead frame block having three rows of the pins projecting downward therefrom. Terminals 19 and 20 extend upward and are bent 90 degrees inward over platform 10 for ultimate connection with the access leads of a circuit module to be mounted. Terminal pins 21 through 26 are arranged in a coordinate matrix and are spaced to correspond to the pin sockets of a printed wiring board or other parent circuit, not shown in the drawing. The interconnections of each lead frame block 11 and 12 may comprise individual conducting elements connecting terminals 19 and 20 and particular terminal pins of the pin rows. Generally, the first terminal of the row of terminals 19 and each succeeding nth terminal (in the case being described, each succeeding third terminal) is extended directly downward to end as a terminal pin 22. Similarly, the first terminal of the row of terminals 20 and each succeeding nth terminal (in the case being described, each succeeding third terminal) is extended directly downward to end as a terminal pin 25.

Figure 3:
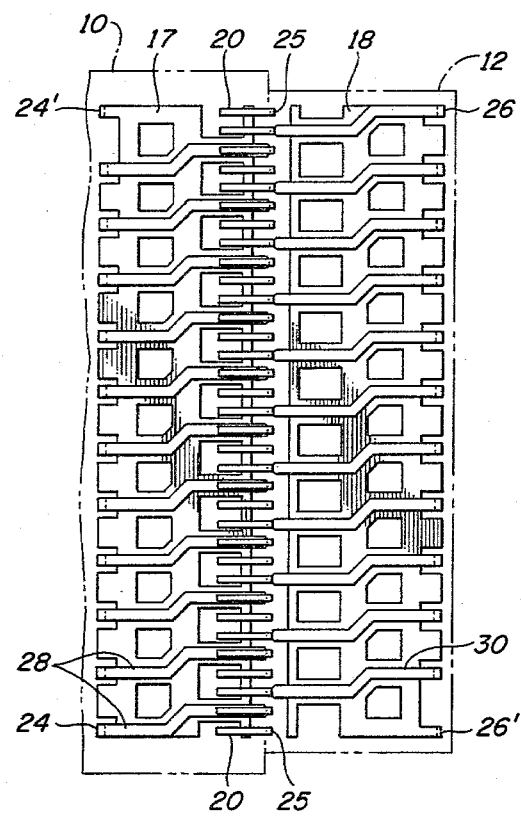
FIG. 3 depicts a top plan view of the metallic elements of the lead frame shown in the foreground of FIG. 1.

The second and each succeeding nth terminal of the rows of terminals 19 and 20 are connected, respectively, to the first and succeeding terminal pins of the rows of terminal pins 21 and 24 by means of conducting elements 27 and 28. The third and each succeeding nth terminal of the rows of terminals 19 and 20 are connected, respectively, to the second and succeeding terminal pins of the rows of terminal pins 23 and 26 by means of conducting elements 29 and 30. The conducting elements are shown by representative ones in hidden outline in FIG. 1, in section side view in FIG. 2, and in top plan view for those of lead frame block 12 in FIG. 3. Ground plane elements 15, 16, 17, and 18 are electrically connected to the end terminal pins of rows 21, 23, 24, and 26, respectively. These connections are partially visible in FIGS. 1 and 3 where ground plane element 16 is shown as connected to terminal pin 23′, ground plane element 17 as connected to terminal pin 24′, and ground plane element 18 as connected to terminal pin 26′. As is the case with the continuous extension of terminals 19 and 20 to terminate as terminal pins 22 and 25, conducting elements 27 through 30 may comprise coplanar horizontal (as viewed in the drawing) segments of conductors presenting at one end terminals 19 and 20 and at the other end terminal pins 21, 23, 24, and 26. As depicted in the plan view of FIG. 3, the ground plane elements may be selectively apertured to accord with the contours of the embedded conducting paths to provide optimum control of the impedance of the latter paths. The latter objective will also determine the parallel spacing between the ground planes 15 through 18 and the lead frame block embedded conducting paths.

As mentioned hereinbefore, the embodiment of this invention described in the foregoing represents only an illustrative module mounting arrangement according to the invention principles. As such, its specific flexibility permits the mounting of modules having an access lead number less than that shown in the drawing. Thus, less than all of the terminals 19 and 20 on platform 10 may be connected, either in groups or in successive different alternating connections. The structure of FIG. 1 may also be modified within the spirit of the invention to accommodate modules of lesser lead number by eliminating the outer rows of terminal pins 21 and 26 and the supporting lead frame block portions and the embedded ground planes 15 and 18. Other arrangements and modifications will also be devisable by one skilled in the art without departing from the scope of the invention as limited only as defined in the accompanying claims.

What is claimed is:

1. Electrical interconnection apparatus for adapting the terminal pattern of a first electrical component of first spacings to the terminal pattern of a second electrical component of second, greater spacings comprising an electrically insulative platform for supporting said first component, a row of n groups of terminals plus one terminal arranged on one side of said platform corresponding to said terminal pattern of said first component, each of said groups including three terminals, an insulative lead frame block mounted on the underside of said platform, a first row of n+1 terminal pins having said second spacings extending from said lead frame block aligned with said row of n groups of terminals, a second and third row of n+1 terminal pins each having said second spacings extending from said lead frame block on respective sides of said first row of terminal pins, first electrical conducting means for connecting the first terminals of each of said n groups of terminals and said one terminal to successive pins of said first row of terminal pins, second electrical conducting means for connecting the second terminals of each of said n groups of terminals and said one terminal to successive pins of said second row of terminal pins beginning with the first pin of said last-mentioned row, third electrical conducting means for connecting the third terminals of each of said n groups of terminals and said one terminal to successive pins of said third row of terminal pins beginning with the second pin of said last-mentioned row, and means for determining the impedance of said second and third electrical conducting means comprising first and second ground plane elements supported by said lead frame block between said first and second row of terminal pins and said first and third row of terminal pins, respectively, said first ground plane element being connected to the last terminal pin of said second row of pins and said second ground plane element being connected to the first terminal pin of said third row of pins.

* * * * *